United States Patent
Cho

[11] 3,963,489
[45] June 15, 1976

[54] METHOD OF PRECISELY ALIGNING PATTERN-DEFINING MASKS

[75] Inventor: Kon Ho Cho, West Windsor, N.J.

[73] Assignee: Western Electric Company, Inc., New York, N.Y.

[22] Filed: Apr. 30, 1975

[21] Appl. No.: 573,506

[52] U.S. Cl. .............................. 96/27 R; 96/35.1; 96/38.3; 156/11; 156/16; 156/17
[51] Int. Cl.² .................................. H01L 21/312
[58] Field of Search ............ 156/3, 11, 16, 17, 395; 96/27 R, 36.2, 35.1, 38.3; 29/580

[56] References Cited
UNITED STATES PATENTS

| | | | |
|---|---|---|---|
| 3,680,205 | 8/1972 | Kravitz | 156/17 |
| 3,759,767 | 9/1973 | Walls | 156/17 |
| 3,782,942 | 1/1974 | Compare | 96/36.2 |
| 3,813,310 | 5/1974 | Droege et al. | 156/3 |

Primary Examiner—Douglas J. Drummond
Assistant Examiner—Jerome W. Massie
Attorney, Agent, or Firm—K. R. Bergum; M. Y. Epstein

[57] ABSTRACT

A method of precisely aligning a pattern on one side of an opaque substrate with a pattern on the opposite side thereof through the use of pattern-defining masks, wherein at least certain pattern areas previously not formed on the substrate, as defined selectively through the masks, are formed while the masks are aligned. The first mask is releasably secured to a first side of the substrate so as to define a particular orientation of a desired pattern therethrough, and is dimensioned such that at least one, but preferably several spaced peripheral areas thereof extend beyond adjacent peripheral edge portions of the wafer, with the extended mask areas including alignment indicia. A second mask is then positioned against a second side of the substrate, and is constructed with one or more outwardly extending peripheral areas and respectively associated alignment indicia corresponding in number, and spatial relationship, with those in the first mask. The second mask is then oriented such that the alignment indicia thereof are brought into precise registry with the corresponding alignment indicia of the first mask so as to ensure that the pattern-defining portions of the masks are in precise alignment on opposite sides of the substrate.

6 Claims, 10 Drawing Figures

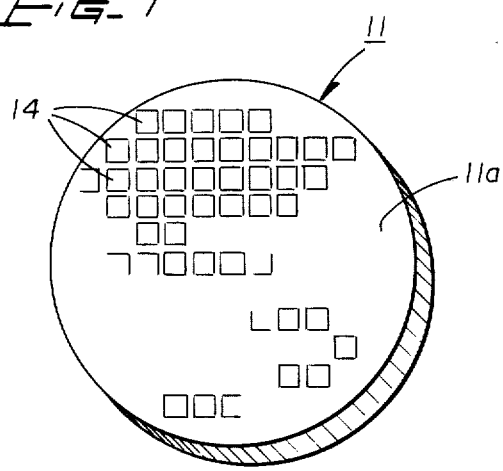
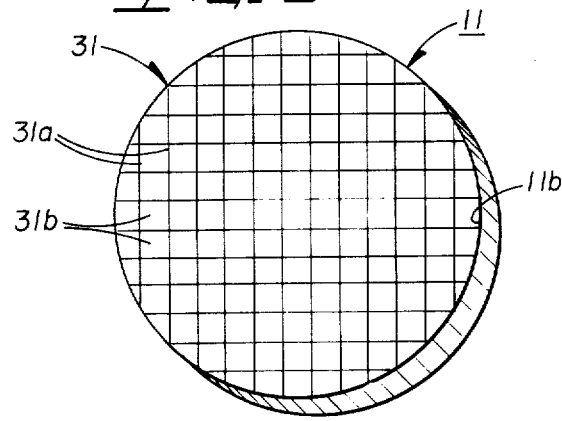
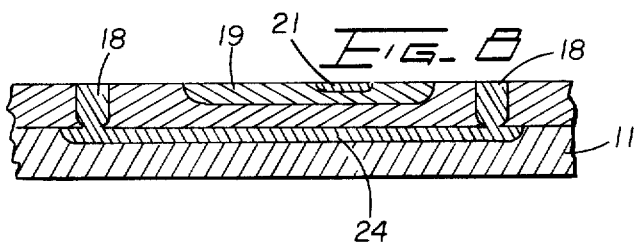
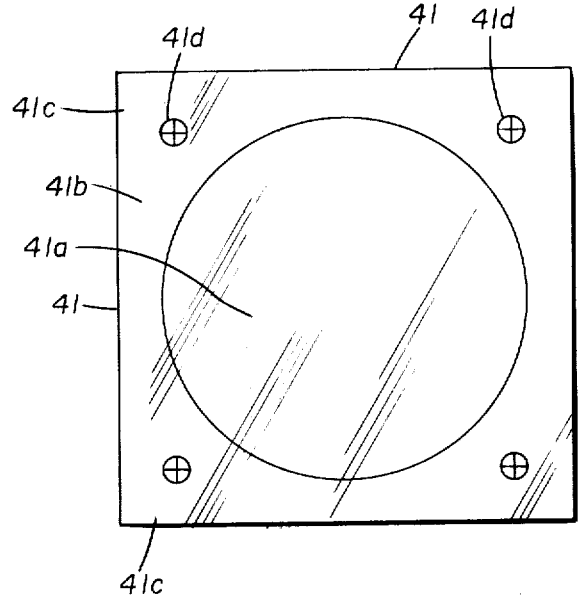
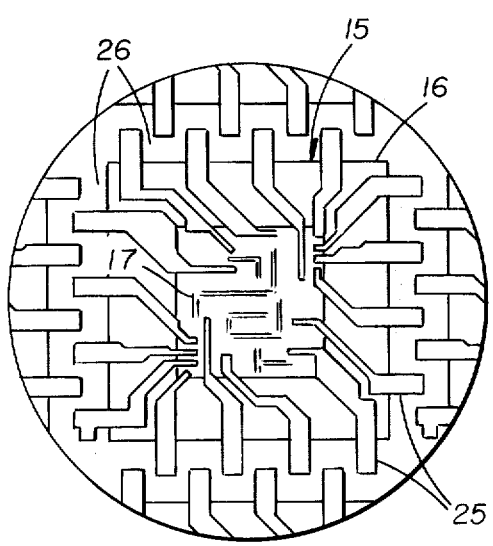
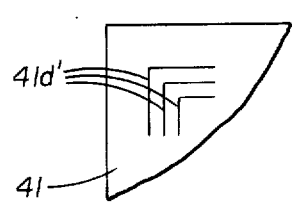
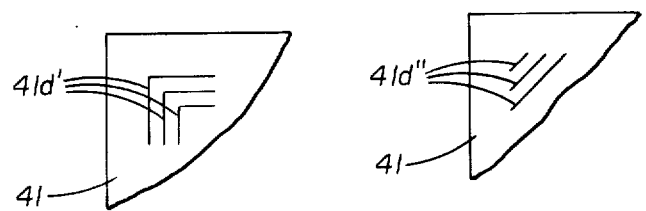

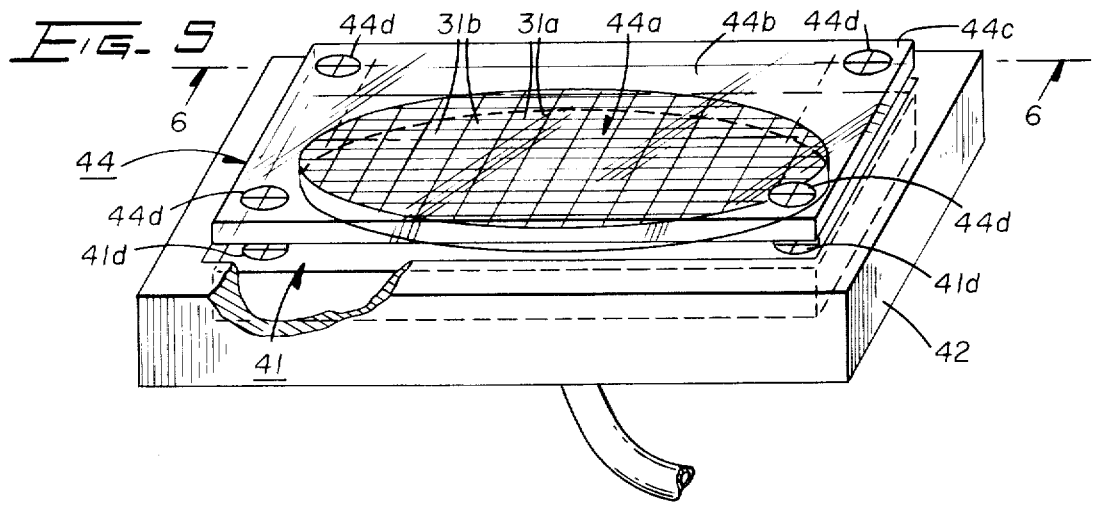
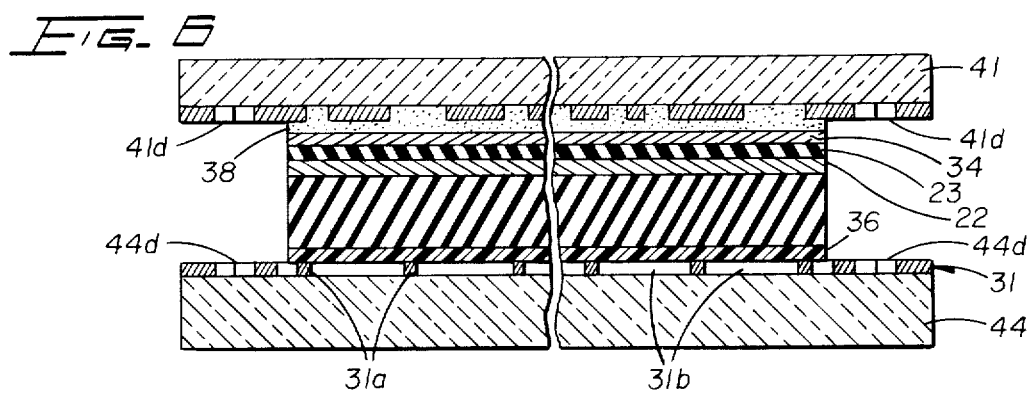
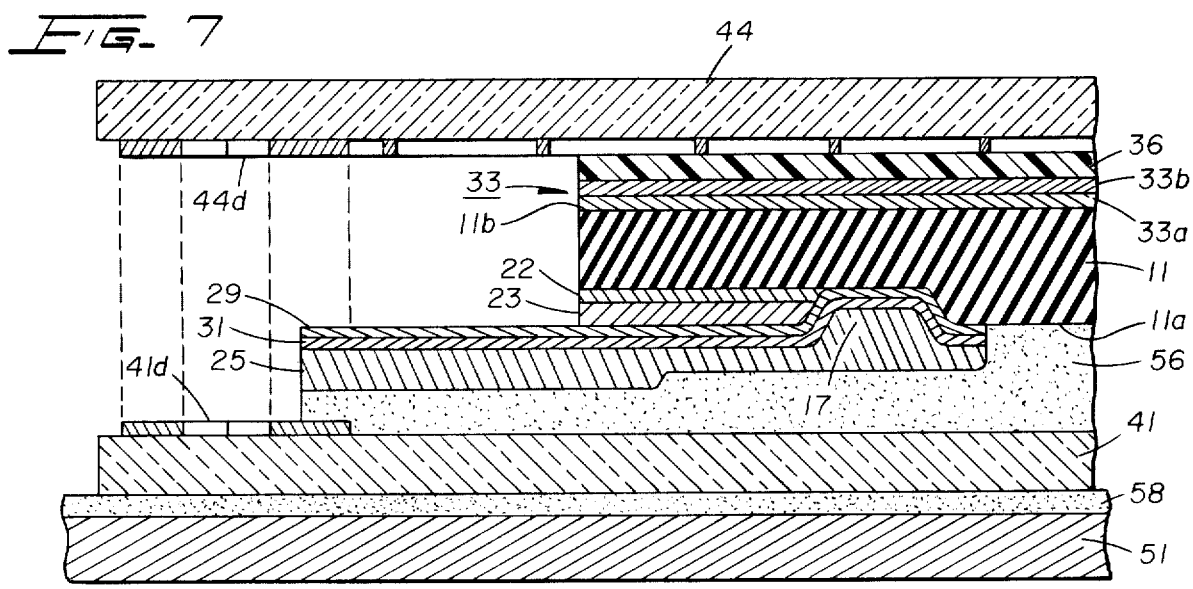

METHOD OF PRECISELY ALIGNING PATTERN-DEFINING MASKS

BACKGROUND OF THE INVENTION

1. Field of the Invention

The present invention relates to the precise alignment of double-sided patterns and, more particularly, to methods of precisely aligning pattern-defining masks on opposite sides of an opaque substrate, such as a silicon wafer, during the processing of integrated circuits thereon.

2. Description of the Prior Art

Properly oriented patterns are often desired on opposite sides of many different types of opaque bodies constituting articles of manufacture. Such articles may range, for example, from complex double-sided printed circuit boards and miniaturized shadow masks, to decorative articles or panels, to mention but a few. Recently, however, exceedingly precise double-sided pattern alignment has become of critical importance in the manufacture of semiconductor devices, including complex integrated circuits of either the so-called medium scale or large scale integration (MSI or LSI) types. While the mask alignment methods of the present invention will be described in connection with their beneficial application in the manufacture of semiconductor devices and circuits, and particularly those utilizing beam leads, it should be fully appreciated that the alignment methods disclosed and claimed herein may have equal utility in the manufacture of diverse articles including those of the types mentioned hereinabove.

With particular reference to complex IC circuits, they typically include from several to hundreds of active and passive elements fabricated on each of a plurality of discrete, sub-dividable chip-areas initially formed on a common silicon wafer. Such wafers generally measure from 1 to 3 inches in diameter. Each IC chip fabricated on such a wafer may typically have cross-sectional dimensions in a range of 5 to 250 mils in width and/or length, and normally in a range of 1.5 to 20 mils in thickness.

With each chip being of such minute dimensions, it is appreciated that the wafer must be sub-divided along very precisely defined grid lines if the resultant individual IC chips are not to be impaired. Complicating the problem of chip separation is the fact that beam leads are often formed as an integral part of the integrated circuits. These leads are employed to effect both electrical and mechanical connections with an associated header or with terminal pads formed on a supporting substrate. As is well known, of course, beam leads extend outwardly from each chip in a cantilevered manner, which results in such leads actually crossing the respectively adjacent chip separation zones, typically formed as a coordinate pattern of intersecting grid lines on the back side of the wafer. Such beam leads are disclosed, for example, in M. P. Lepselter U.S. Pat. No. 3,335,338. Because of the cantilevered nature of the beam leads, it becomes readily apparent that the processed semiconductor wafer cannot be separated along the observable front side chip spacing zones by a conventional scribing process, utilizing either a diamond cutter or a laser, for example, as such an operation would seriously impair, if not actually sever, the end regions of the cantilevered beam leads.

For that reason, it has been required in the manufacture of beam lead semiconductor devices and ICs to form a chip separation grid pattern on the back side of the opaque wafer, normally of silicon. Such a grid pattern must necessarily be precisely oriented with the boundary lines defining each integrated circuit processed on the front side of the wafer. To appreciate the degree of double-sided pattern alignment accuracy required, the maximum allowable tolerance variation between the patterns for very high circuit density wafers is often restricted to a range of one to several microns.

In view of such stringent alignment accuracy, it became readily apparent very early in the development of IC manufacturing processes that the use of mechanically mounted, pre-aligned masks were generally unsuitable because of their inherent mechanical tolerance variations. As a result, infrared light has often been employed heretofore in situations where the substrate thickness is not more than 1.5 to 2 mils in thickness. Even then, however, the resolution of the metal intraconnections and beam leads on the front side of the wafer is normally less than ideal, primarily because of depth-of-field problems. Further, when the adjacent chip separation grid pattern lines are exceedingly close, relatively expensive and complex pattern magnification systems are generally required, involving either expensive microscopes or systems utilizing a CRT for display purposes.

It is appreciated, of course, that whenever infra-red light is employed, the composition of the substrate, as well as the thickness thereof, has a considerable bearing on the effective resolution of an active side metallized circuit pattern observed therethrough. With the advent of silicon wafers having specialized surface coatings formed thereon, such as sapphire or spinel on silicon (employed to attain certain optimized operating characteristics), the use of infrared light may be even further restricted as a means of achieving precise pattern alignment.

The use of infrared light for mask alignment purposes has been completely ruled out in one IC manufacturing process wherein a magnetic layer is formed on the back side of the wafer. Such a layer is often desired to facilitate the handling of the wafers during at least certain integrated circuit processing steps before the later are packaged into discrete circuit modules. Such a magnetic layer effectively blocks infrared light, thus preventing the use of such light for double-sided pattern alignment. For further details with respect to the use of magnetic coatings, reference is made to U.S. Pat. No. 3,692,168, issued Sept. 19, 1972, of H. E. Hughes, J. S. Morton and M. H. Wachs; and U.S. Pat. No. 3,612,955, issued Oct. 12, 1971, of A. D. Butherus, M. C. Huffstutler and J. A. Morton, both of which patents are assigned to the Bell Telephone Laboratories, Inc.

In view of the problems encountered heretofore in readily established precise mask-defined pattern alignment on opposite sides of semiconductors wafers, and particularly when a magnetic coating is present, an alternative technique was developed and is disclosed in U.S. Pat. No. 3,759,767, of D. C. Walls, commonly assigned to the assignee of the present invention. The alignment method disclosed therein involves forming a plurality of alignment holes (preferably with a laser) partially through the wafer at specified alignment sites on the circuit side thereof. Thereafter, a portion of the back side of the wafer is removed to join the holes to the back side. In accordance with a method of making semiconductor devices, a photoresist layer is then formed on the back side of the substrate so that the holes remain distinguishable. The chip separation mask is then positioned on the photoresist layer and aligned with the holes. While this technique can provide accurate double-sided pattern alignment, it necessitates a number of carefully controlled and time consuming process steps.

Attempts have also been made to etch (as distinguished from drill) microscopic alignment holes completely through a silicon wafer. Unfortunately, such an etching process requires additional masking steps, is time consuming, and produces holes of relatively larger diameter than those produced with a laser, for example, because of undesired lateral etching.

SUMMARY OF THE INVENTION

In accordance with one unique, illustrative method for precisely aligning patterns on opposite sides of an opaque substrate, a first mask is releasably secured temporarily to a first side of the substrate so as to define a particular orientation of a desired pattern thereof relative to the substrate. The first mask, as embodied herein, is dimensioned such that at least one peripheral area thereof extends beyond the adjacent peripheral edge portion of the substrate when the mask is mounted thereon, and with the extended area being formed with at least one alignment indicium.

A second mask is then positioned at least closely adjacent a second side of the substrate such that at least one peripheral area thereof extends beyond the adjacent peripheral edge portion of the substrate. The extended area of the second mask is likewise formed with at least one alignment indicium which, when aligned with the corresponding alignment indicium of the first mask, insures that the first and second mask patterns on opposite sides of the substrate are in precise mutual registration.

Such a mask alignment method has particular application in the manufacture of semiconductor devices and integrated circuits, particularly in connection with forming chip separation grid patterns on the back side of IC wafers. For such an application, the alignment masks are each preferably formed with two or more correspondingly spaced alignment indicia, and with the first mask being temporarily secured to the front side of the wafer through the use of a suitable bonding material, such as a wax.

By obviating the need for either infrared light or drilled or etched alignment holes, the present method is also equally applicable for use in producing precisely aligned patterns on opposite sides of other diverse articles, including printed circuit boards, shadow masks, etc., as mask alignment is in no way dependent on the thickness and/or composition of the article interposed between the masks.

BRIEF DESCRIPTION OF THE DRAWINGS

FIG. 1 is an enlarged perspective view of a semiconductor wafer, with a plurality of integrated circuit chips (only a few of the total being shown for purposes of illustration) formed on the active face thereof;

FIG. 2 is an enlarged perspective view of the back side of the semiconductor wafer of FIG. 1, showing a circuit chip separation grid pattern formed thereon in accordance with the principles of the present invention;

FIG. 3 is a greatly enlarged, detail plan view of one illustrative beam lead integrated circuit from the array thereof generally depicted in FIG. 1;

FIG. 4 is an enlarged, plan view of one pattern-defining mask constructed and bonded to the front side of a semiconductor wafer in accordance with the principles of the present invention;

FIG. 5 is an enlarged, perspective view of a semiconductor wafer with two pattern-defining masks of the type depicted in FIG. 4 mounted on opposite sides thereof, with the corresponding alignment indicia formed in the outwardly extending and mutually disposed areas thereof being oriented so as to be in precise registration and to, thereby, precisely align the respective patterns defined by the two masks;

FIG. 6 is an enlarged, fragmentary sectional view, taken along the line 6—6 of FIG. 5, showing the manner in which the upper mask is temporarily bonded to the front side of the semiconductor wafer;

FIG. 7 is an enlarged, fragmentary, cross-sectional view of a substantially completely processed semiconductor wafer showing in particular an intraconnecting lead, a beam lead, back side magnetic layer, and two alignment masks employed to form a chip separation grid pattern over the magnetic layer as one of the final processing steps in accordance with the principles of the present invention;

FIG. 8 is a cross-sectional view of a typical transistor formed in part with masks and pattern alignment methods of the type embodied in the present invention, and FIGS. 9 and 10 are enlarged, fragmentary views of several alternative forms of alignment indicia applicable for use in accordance with the principles of the present invention.

DETAILED DESCRIPTION

General Background of Typical IC Manufacturing Process

As previously mentioned, the mask aligning methods embodied herein have universal application, but for purposes of illustration, they are described in connection with the manufacture of sealed junction integrated circuits. In accordance with one preferred method of fabricating such circuits, a wafer 11 of the type depicted in FIGS. 1 and 2 is initially formed by slicing across a single crystal ingot, typically of silicon. Using well known techniques, the wafer 11 is thereafter generally lapped ( to reduce its thickness), polished and subjected to a succession of processing operations including selective impurity doping and metal deposition in order to fabricate discrete IC circuit chips 14 on the active side 11a of the wafer in an array only partially depicted in FIG. 1.

During the simultaneous processing of the integrated circuits, the wafer 11 advantageously functions as a common substrate for all of the circuits. One such circuit 15 is generally depicted in FIG. 3, and is confined within the boundary 16. The dimensions of such an IC boundary may typically be of the order to 5 to 250 mils along any one side, and may include therewithin from several to hundreds of active and passive circuit elements, such as in the form of transistors, diodes, resistors and capacitors, as well as selective composite combinations thereof. The circuit elements associated with a given IC chip 14 are intraconnected by deposited metal (preferably gold) leads 17 which may typically be as small as from 1 to 3 microns in width, with the length being dependent, of course, on the nature of the circuit, but typically of the order to 5 to 50 mils.

With respect to a typical diffused IC transistor, for example, the various processing operations normally start with the formation of a "buried layer" of concentrated P+ or N+ material beneath the surface of the wafer, as defined by precisely located windows in a photoresist coating. This operation is thereafter typically followed by four additional diffusion operations, the isolation, deep collector, base and emitter diffusions, performed in that order. All of these processing steps finally lead to the formation of the active (as well as passive) elements, and with respect to the so-called buried layer diffused transistor, may take the form generally depicted in the fragmentary, cross-sectional view of FIG. 8. As depicted therein, the transistor comprises an N+ doped buried collector 18, a P-doped base 19 and an N+ doped emitter 21. From an exterior standpoint, a finally fabricated integrated circuit chip 14 would typically further include, as depicted in cross-section in FIG. 6, and excluding any leads, a thin layer 22 of silicon dioxide and an overlayer 23 of silicon nitride, both dielectrics, for passivation purposes. For further details of the method steps and materials involved in the manufacture of not only integrated transistors, but diodes, capacitors and resistors, reference is made to the December, 1967, issue of the *Western Electric Engineer*, particularly pages 3–15.

In one preferred type of IC circuit, external connections are made thereto through the formation of beam leads 25 (see FIGS. 3 and 7) which extend outwardly from the adjacent edges of a given integrated circuit boundary 16, and into a chip separation zone 26. As such, the terminating end regions of the beam leads 25 actually extend in a cantilevered fashion beyond the physical edges of each IC chip 14 after the latter has been severed from the common wafer 11. These leads are generally formed by electroplating gold through precisely constructed masks on the active side 11a of the wafer 11. The beam leads 25 (as well as the intraconnecting leads 17) are underlaid with successive layers of platinum silicide (not shown), titanium 29 and platinum 31, in that order, as depicted in FIG. 7.

In order to conserve circuit real estate and, hence, increase packing density of the IC circuits on a wafer of given size, the mutually disposed beam leads 18 of adjacent circuits, as depicted in FIG. 3, are typically interleaved. As such, it becomes readily apparent that conventional scribing techniques cannot be used to cut or fracture the wafer 11 from the active side 11a, as such techniques would sever the cantilevered end portions of the beam leads 18.

For that reason, a precisely oriented IC chip separation grid pattern 31, such as depicted in FIG. 2, must be formed on the inactive or back side 11b of the wafer 11. This grid pattern, generally formed with a photolithographic process, allows the wafer to be subdivided, by a separate etching process, along finely divided chip separation grid lines 31a (best seen in FIGS. 2 and 5). With an etchant such as buffered hydrofluoric acid, the cantilevered gold beam leads 25 are in no way affected upon the sub-dividing of the wafer 11.

In addition to the processing steps involved in the manufacture of integrated circuits described hereinabove, it is often desirous, as previously noted, to apply a magnetic coating or layer 33 (see FIG. 7) on the back side 11b of the wafer so as to facilitate automated handling of the wafers during at least certain processing operations, such as circuit testing. A composite magnetic layer 33 is preferably formed of an electrolessly plated underlayer 33a of nickel and an electroplated overlayer 33b of permalloy. The composite magnetic layer 33, of course, may also comprise a single homogenious layer, and may be formed utilizing any one of a number of other metal deposition processes, such as sputtering or evaporation.

Double-Sided Pattern Alignment Methods

With respect to mask alignment, as well as mask construction for use in integrated circuit manufacture, it should be appreciated that the masks typically have pattern sizes no larger than 1.8 millimeters square, with individual images within the patterns as small as 2.5 microns square. Such minute dimensions typically necessitate tolerances in the range from ±0.5 microns to ±1.3 microns. In view of such dimensions and tolerances, it becomes readily apparent that not only the various masks required during the processing of the integrated circuits 15, but the mask required to form the back side chip separation grid pattern 31, must be precisely aligned in a consistent and reliable manner if high circuit yields are to be achieved.

The mask alignment methods embodied herein may be employed in several different ways, and at several different times during the processing of integrated circuits. For example, the earliest practicable time at which a chip separation grid pattern 31, such as depicted in FIG. 2, may be readily formed on the back side of the wafer 11 is in connection with the formation of the initial photoresist diffusion pattern on the front or active side of the wafer 11. A photoresist layer 34 for that purpose is depicted in FIG. 6, and would normally occur after the aforementioned initial silicon dioxide layer 22 had been applied to the active side 11a of the wafer. A back side photoresist layer 36, for producing the chip separation grid pattern 31, is also depicted in FIG. 6. It, of course, should be appreciated that the photoresist layer 36 may also be applied to the back side 11b of the wafer at any subsequent time when a mechanical mask is required on the active side of the wafer to define diffusion regions or metal deposition areas for the conductive paths of the integrated circuits.

In this connection, it should be noted that whenever it is desired, for example, to either lap the back side of the wafer or apply a magnetic layer thereon, or both, before the wafer is sub-divided, the point in time at which the chip separation grid pattern 31 (or any other pattern) is formed thereon must necessarily follow such IC processing operations. One alternative processing sequence involving double-sided mask alignment will be described in greater detail hereinafter in connection with the formation of a composite magnetic layer 33 on the back side of the wafer 11.

For now, however, it will be assumed that the grid separation pattern 31 is formed on the back side 11b of the wafer 11 at the earliest convenient opportunity, namely, in connection with the initial layer of photoresist 34 being applied on top of the initial silicon dioxide layer 24 on the front side 11a of the wafer. The photoresist may be readily applied as thin, uniform layers 34 and 36, by spinning the wafer at a relatively high speed during the application of the photoresist in a fluid state first to one side and then to the other side in successive steps. A negative acting photoresist is generally preferred (but not required), and may be purchased from a number of sources, such as from the Eastman Kodak Company under the trade name "KMER", or from the Hunt Chemical Company, under the trade name "Waycoat".

Thereafter, a bonding material 38 (FIG. 6), such as in the form of a low-melting wax, is preferably applied as a thin film coating to one side of a pattern-defining mask 41, with the latter then being temporarily bonded to the front or active side 11a of the wafer 11. The wax may comprise any one of a number of conventional types that melt at a temperature of approximately 80°C. One preferred wax composition found to be particularly effective for the purpose intended is composed of a solution of Crystalbond wax sold by Aremco Products Company, dissolved in acetone having a percentage concentration of about 10%. A thin uniform layer of such a wax is most readily applied on the mask 41 by spinning the latter in a suitable fixture at approximately 1500 rpm. It should be understood that a number of other waxes and/or bonding materials, such as Eastobond M-5005 wax, sold by Eastman Chemical Products, Inc., may be used with equal effectiveness.

Bonding of the mask 41 to the front side 11a of the wafer, through the interposed layers of photoresist 34 and wax 38, respectively, is preferably accomplished while the wafer is supported in a suitable fixture, such as the one identified by numeral 42 in FIG. 5, having a base with a vacuum orifice. In order to facilitate such bonding, the mask is preferably gently heated using, for example, a conventional heat gun or an infrared lamp, in conjunction with pressure uniformly applied against the mask.

In addition to effecting reliable, temporary mask securement to the wafer, the bonding wax, particularly when applied to the mask 41 as a uniform, thin film, also effectively and very beneficially functions as a spacer so as to minimize any damage to both the mask and the photoresist layer therebeneath. As such, the layer of bonding wax inherently produces a so-called "proximity printing" type of pattern generation through the mask 41.

It is appreciated, of course, that in certain pattern alignment applications, the mask 41 could be made, at least in part, of conductive magnetic material, for example, so that the mask could be releasably secured to one side of a substrate or wafer, already formed with some metallic portions thereon, by magnetic attraction. Conversely, at least selected pattern portions on the substrate or wafer could be formed of magnetic material so that mating conductive portions of the mask would be magnetically attracted thereagainst.

In accordance with the principles of the present invention, and as best seen in FIGS. 4–6, the mask 41 is typically formed with a square or rectangular cross-section, having a pattern-defining central portion 41a, and an outer, peripheral frame portion 41b. The mask may be formed with just one outwardly extending area 41c, and including only one alignment indicia formed therein, when the size of the mask is relatively large, such as when employed to align patterns on opposite sides of printed circuit boards and the like, where the patterns are normally not only of appreciable dimensions, but formed with tolerance variations measured in millimeters rather than microns. With respect to the fabrication of IC's, however, the alignment mask 41 is preferably dimensioned to include at least two, but preferably four outwardly extending areas 41c, most readily formed by the corner regions thereof, that each respectively includes at least one alignment indicium, such as generally represented by the bulls-eye 41d depicted in FIGS. 4 and 5.

It is readily apparent, of course, that the alignment indicia 41d may take any one of a number of other forms, such as straight, angular or curved lines or bars, spatially arranged in either singular fashion, or in groups, and located on either the upper or lower surface (as shown) of the mask 41, or on both surfaces. Two of such other possible types of alignment indicia are depicted in the fragmentary views of FIGS. 9 and 10, with the former disclosing a set of right-angle bars 41d', and the latter disclosing a set of parallel extending, diagonally oriented straight bars 41d''. Concomitantly, the alignment indicia may comprise repetitive pattern segments, i.e., border extensions of the major usable circuit pattern portion of the mask.

Alternatively, the alignment indicia 41d may be formed as either positive or negative etched (or otherwise formed) apertures, slots or specially configured patterns that extend through the mask 41. In connection with the various possible types of alignment indicia, and the various techniques available for forming them, it should also be appreciated that the indicia may be formed as either positive or negative images on or in the mask 41, and as the same or opposite, complementary images in a second mask 44 (FIGS. 5–7) to be aligned therewith, in accordance with the principles of the present invention. As such, reference to a mask alignment "indicium" herein is intended to encompass not only a single mark or opening of any geometric configuration, but groups or sets thereof, or repetitive circuit pattern segments, in each extended mask area used for alignment purposes.

After the mask 41 has been properly mounted on and temporarily bonded to the side 11a of the wafer 11, unit is then demounted from the fixture 42 (FIG. 5) and turned upside down so that the second mask 44, as shown, may be mounted on the then upwardly exposed back side 11b of the wafer 11. Also in accordance with the principles of the present invention, the second mask 44, as the first mask 41, is constructed such that it not only includes the normal central pattern-defining portion 44a and the peripheral frame portion 44b, but at least two, and preferably four, outwardly extending peripheral areas 44c when properly mounted on the back side 11b of the wafer 11. Considering the areas 44c more particularly, they preferably extend as corner regions beyond the adjacent edge portions of the wafer 11, and are located such that the respective alignment indicia thereof, such as in the form of four bulls-eyes 44d arranged in space quadrature, may be brought into precise registration with the corresponding alignment indicia 41d of the mask 41. In this manner, the pattern-defining areas 41a and 44a of the two masks are assured of being in precise alignment on opposite sides of the opaque wafer 11.

As previously mentioned, it is because the spacing between adjacent integrated circuit boundaries 16 may be as small as 1 mil or less, that exceedingly accurate alignment of the chip separation grid pattern 31 relative thereto must be consistently achieved. If precise alignment is not attained, the finally processed integrated circuits may be readily damaged upon being sub-divided into discrete chips 14.

As for the nature and composition of the masks 41, 44, they may comprise any one of a number of different types, such as photographic emulsion or metal film on glass, or etched mechanical types. As such, they may be made out of any one of a number of suitable materials, including glass, stainless steel, nickel or copper-nickel combinations, to mention only a few. One preferred mask for use in carrying out the alignment methods embodied herin comprises a well known chrome-on-glass mask. Such a mask is readily fabricated by coating the thin chrome layer previously deposited on the glass with a thin layer of photoresist. The photoresist is then placed in contact with the emulsion of either the master mask, or a sub-master mask, and exposed to ultraviolet light. The finished pattern on the glass mask is thus a mirror-image of the master mask. The use of chrome-on-glass masks is generally preferred over the emulsion-on-glass type because the former not only increases the product-master-to-master yield, but also increases the number of device wafer exposures possible per mask. As for mechanical masks, tolerances less than ±1 mil are often difficult to achieve because of the necessary mask thickness required to maintain a relatively uniform, planar relationship between the mating surfaces of the substrate or wafer and the mask.

Once the respective mask patterns have been accurately aligned, the photoresist layers 34 and 36 are exposed through the respective masks 41 and 44 and, thereby, selectively polymerized (in the case of a negative photoresist) so as to partially establish the desired, precisely aligned patterns on opposite sides of the wafer 11. As previously noted, the initial photoresist pattern defined by the first mask 41 would normally be employed to define the minute windows (exposed window regions) through which an N-doping agent, for example, would thereafter be diffused into the active side 11a of the wafer. These areas, as previously described, subsequently define the active device areas for each of the integrated circuits 15 to be fabricated thereafter. Similar photoresist patterns, of course, are also subsequently employed during circuit processing to define areas in which dielectric layers and/or metallized intraconnections and/or beam leads are to be formed.

After the photoresist layers 34 and 36 have been adequately exposed to ultraviolet light through the masks 41 and 44, the masks are removed from the wafer 11, and the latent patterns formed on the photoresist layers are developed.

Removal of the temporarily bonded mask 41 from the active side 11a of the wafer is readily accomplished by heat being applied against the mask at a relatively low temperature, such as in the range of 70°–120°. Such heat may be readily produced with the same aforementioned heat gun or infrared lamp employed to initially bond the mask 41 to the wafer 11. Suitable solvents, such as acetone, may also be employed with or without the application of heat to separate the mask 41 from the wafer. In any event, such a solvent may be desired to wash away any wax residue that may still remain on the active side of the wafer after the mask has been removed therefrom.

With particular reference to the back side chip separation grid pattern 31, and with a negative type of photoresist being assumed, it is formed by the mask 44 having been initially constructed with a grid pattern configured with opaque, coordinate intersecting lines 31a that enclose transparent squares 31b, as depicted in FIG. 5. The grid lines 31a thus overlie the wafer material that must be removed in order to sub-divide the wafer 11 into discrete IC chips 14 during a subsequent etching operation. As such, each grid pattern square 31b necessaarily underlies and is slightly larger than the boundary 16 of a respectively aligned integrated circuit 15 (FIG. 3) on the opposite side of the wafer 11.

Upon washing the developed photoresist layer 36, the undeveloped portion thereof is removed so as to expose the back surface 11b of the wafer only along the coordinate chip separation grid lines 31a (best seen in FIG. 2). All other areas of the photoresist layer 36, which has respectively been beneath the transparent squares 31b of the mask 44, remain on the substrate by reason of having been polymerized during the previous exposure to ultraviolet light.

When the wafer 11 is finally ready for sub-dividing into discrete IC chips, the exposed back side wafer surface, in the form of the grid separation lines 31a, are brought into contact with an etchant.

One preferred etchant consists of a mixture of about five parts nitric acid, three parts acetic acid and one part hydrofluoric acid. This etchant is often used in a two-stage sequence with another etchant, such as buffered hydrofluoric acid. These etchants effectively attach and erode away the semiconductor wafer material along the rather sharply defined grid pattern lines so as to separate the individual integrated circuits into discrete chips 14, with minimal lateral etching being encountered. The degree of lateral etching, of course, can be even further minimized by lapping the back side 11b of the wafer so as to reduce the thickness thereof prior to the step of forming the chip separation grid pattern 31 thereon.

In connection with the chip separation etching operation, it may be desired, particularly in high volume applications, to temporarily bond the active side 11a of the substantially completely processed wafers to a suitable transporting carrier, indicated generally in FIG. 7 by the reference numeral 51, either before or after the reference alignment mask 41 has been removed from the wafer 11. Such bonding of the wafer to the carrier may be readily accomplished by utilizing a low-melting wax of the same (or similar) type used to bond the mask 41 to the wafer.

In the case of bonding the wafer directly to the carrier, i.e., after the mask 41 has been removed (not as shown), this is most readily effected by first depositing and melting a layer of wax 56 (as distinguished from a layer 58) on the carrier 51, and then placing the active side 11a of the wafer directly into the melted wax layer. It should be noted at this point that a mask 41 is shown as optionally interposed between the wafer 11 and carrier 51 in FIG. 7, and bonded by a wax layer 58 to the latter, for applications where a magnetic layer 33, for example, is to be formed on the back side 11b of the wafer before the chip separation grid pattern 31 is aligned and formed in conjunction with the masks 41 and 44. Such a modified process will be described in greater detail hereinbelow.

With reference again to the situation where the mask 41 has been removed from the wafer 11 prior to the latter being bonded to the carrier 51, the previously exposed photoresist layer 36, if not yet developed and washed, is then so processed to form an exposed chip separation grid pattern on the back side 11b of the wafer. Upon completion of the chip separation etching operation in the manner described hereinabove, the remaining polymerized portion of the photoresist layer 36 is removed from the wafer 11. Thereafter, the completely processed and sub-divided IC chips 14, while still temporarily bonded to the carrier 51, may be readily transported to and accurately aligned at any other desired operating stations before the sub-divided IC chips 14 are separated from the carrier 51 by applying heat to the bonding wax layer 56. Alternatively, solvents such as acetone may be used with or without heat to effect the separation of the discrete chips 14 from the carrier 51.

From the foregoing, it should be readily apparent that the step of forming the back side chip separation grid pattern 31 may take place during any one of a number of stages of IC manufacture, even after all of the integrated circuits have been completely fabricated on the wafer 11. In the latter case, the particular front mask 41 employed for back side pattern alignment may simply comprise a reference mask. Such a mask, of course, may be formed with a very simplified (non-generating) alignment pattern that coincides with as few as two, but preferably four or more metallic reference sites previously processed on the active side of the wafer.

It should also be appreciated that since precise pattern alignment is advantageously not dependent on any mechanical mounting of the two masks relative to each other, the back side mask 44, once aligned with the mask 41 in accordance with the principles of the present invention, may be simply supported in any suitable fixture, such as 42 depicted in FIG. 5, during the exposure of the photoresist layer 36, without any mechanical tolerance problems being involved. Alternatively, the back side mask 44 may be temporarily bonded to the wafer 11 in the same manner as the front mask 41 if desired in certain critical alignment applications, or in situations where the wafers are to be transported on a suitable carrier, to one or more operating stations employed, for example, to expose, develop and wash away the unexposed portions of the photoresist layer 36 in an automated manner.

Attention will now be directed briefly to an alternative mask alignment sequence applicable for use whenever the aformentioned and optional magnetic layer 33 (FIG. 7), for example, is to be formed on the back side 11b of each IC circuit chip. It will be recalled that such a magnetic layer, typically comprising a first layer 33a of nickel and a second layer 33b of permalloy, is often desired to facilitate automated handling of both the processed wafers and the discrete IC chips.

When such a magnetic layer 33 is employed, it is readily apparent that the chip separation grid pattern 31 must be formed on top of the magnetic layer 33, because the latter would otherwise act as a shield to prevent ultraviolet light from being exposed through the mask 44 to the selected pattern areas on the photoresist layer 36. The magnetic layer 33 is typically formed after either mounting the normally substantially completely processed wafer 11 upside-down in a suitable vacuum fixture, such as 42 depicted in FIG. 5, or alternatively, after temporarily bonding the wafer on a suitable carrier 51 of the type generally depicted in FIG. 7. In either event, the front or reference alignment mask 41 must first be aligned with, and temporarily secured to, the previously processed circuit pattern side 11a of the wafer. When a carrier 51 is employed, the joined wafer 11 and mask 41 would preferably be temporarily secured thereto through the use of a layer of bonding wax 58. Just prior to the magnetic layer 33 being applied to the wafer, the back side thereof may be lapped, as previously mentioned, so as to reduce the wafer thickness and, thereby, allow the subsequent chip separation etching step not only to be performed more rapidly, but to minimize lateral etching on either side of the chip separation grip lines, which could otherwise cause circuit damage.

Once the magnetic layer 33 has been formed on the back side 11b of the wafer, the aforementioned photoresist layer 36 is then formed on the outer surface of the magnetic layer (actually the surface of the permalloy layer 33b previously described). Thereafter, the back side mask 44, with its chip separation grid pattern 31, is accurately aligned with the bonded front side reference mask 41.

At that point, the photoresist layer 36 is exposed through the mask 44, with the latter thereafter being removed. The photoresist layer 36 is then developed, with the unexposed portion washed away so as to expose a chip separation grid pattern portion of the magnetic layer for etching. This same pattern, of course, would carry through to the underlying surface 11b of the wafer during etching.

In the situation where the substantially completely processed wafers 11 have been mounted on and temporarily bonded to the carrier 51, once the etching operation to subdivide the wafer is completed, heat and/or solvents may be employed to soften or melt both wax layers 56 and 58, so as to separate both the front reference alignment mask 41 from the adjacent carrier 51, and that mask from the adjacent active side 11a of the wafer itself. In situations where the wafer 11 is simply mounted in a vacuum fixture, such as 42 depicted in FIG. 5, there is only the wax layer 56 (FIG. 7) to be softened or melted by the gentle application of heat and/or with solvents, in order to remove the reference alignment mask 41 from the wafer.

Upon completion of the etching operation, the discrete composite magnetic layers 33 on the back side of each of the chips 14, preferably in conjunction with magnetic facilities, such as permanent magnets or electromagnets (not shown), can facilitate the further transport of the minutely dimensioned IC chips 14 not only on the carrier 51, even after they are no longer bonded thereto, but during any transfer off of the carrier.

It should be appreciated, of course, that the IC manufacturing processes described herein are only intended to be representative of typical processing steps that may be employed in conjunction with the pattern alignment methods embodied herein. To that end, the invention is not restricted to the particular materials, structures and IC processing operations specifically described. For example, dielectric layers of silicon dioxide and silicon nitride have been referred to, but layers of aluminum oxide, various silicates, and the like, may also be used in certain applications with equal effectiveness. Likewise the incorporation of the composite magnetic layer 33 on the back side of each IC chip is not restricted to silicon wafers, but may be applied to a variety of other semiconductive wafer and substrate materials and afford the same beneficial advantages. Finally, the nature, composition and configuration of the double-sided alignment masks, which include alignment indicia formed in or on selected outwardly extending areas thereof in accordance with the principles of the present invention, may take many different forms and still accomplish the desired and beneficial end results described herein, without departing from the spirit and scope of the present invention.

What is claimed is:

1. A method of producing precisely aligned patterns on opposite sides of an opaque substrate comprising the steps of:

releasably securing a first mask temporarily to one of said opposite sides of said substrate so as to define a particular orientation of a desired pattern on said first mask relative to said substrate, said first mask including a peripheral area which extends beyond an adjacent peripheral edge portion of said substrate, said peripheral area containing thereon at least one alignment indicium;

positioning a second mask at least closely adjacent to the other of said opposite sides of said substrate such that at least one peripheral area of said second mask extends beyond an adjacent peripheral edge portion of said substrate in overlaping relation with said peripheral area of said first mask, said peripheral area of said second mask containing thereon at least one alignment indicium;

thereafter moving said masks relative to one another for disposing the alignment indicia thereof into mutual alignment; and without altering the relative mutual alignment of said masks and said substrate, forming aligned pattern areas on said substrate sides through said masks.

2. A method in accordance with claim 1 wherein said first and second masks each includes at least two alignment indicia, with said indicia being correspondingly spaced apart in said first and second masks and respectively located in different outwardly extended areas of each associated mask.

3. A method in accordance with claim 2 wherein said first and second masks are of rectangular configuration, with the respective outwardly extended areas thereof comprising corner regions, and wherein said alignment indicia comprise contrasting opaque and light exposing regions in at least selected ones of said corner regions of each mask.

4. A method of producing precisely aligned patterns on opposite sides of an opaque semiconductor wafer comprising the steps of:

applying a resist coating on each of said sides of said wafer;

bonding a first mask temporarily to a first one of said sides with a low-melting bonding material so as to define a particular orientation of a desired pattern on said first mask relative to said wafer, said first mask being dimensioned such that at least two spaced peripheral areas thereof extend appreciably beyond adjacent peripheral edge portions of said wafer when said mask is properly mounted thereon, and with at least said two extended areas each containing at least one alignment indicium;

positioning a second mask containing a pattern thereon at least closely adjacent to the other of said sides of said wafer such that at least two spaced peripheral areas thereof extend appreciably beyond adjacent peripheral edge portions of said wafer, each of said extended areas of said second mask being formed with at least one alignment indicium, and with the resulting spaced relationship of the alignment indicium of said second mask corresponding to the spaced relationship of the alignment indicia of said first mask, thereby causing the pattern of said second mask to be oriented into precise registration with the pattern of said first mask;

exposing each said resist coating to a light source through the patterns of said masks so as to define desired patterns thereon in mutual alignment; and removing said masks from said substrate, said first mask being removed by at least softening said low-melting bonding material.

5. A method in accordance with claim 4 wherein said first and second masks are of rectangular configuration, and wherein at least said two alignment indicia of each mask are respectively confined within different extended areas comprising corner regions thereof.

6. A method in accordance with claim 5 wherein at least one alignment indicium is formed in each corner region of each of said first and second masks, with said alignment indicia in each mask being arranged in a corresponding space quadrature relationship.

* * * * *